United States Patent [19]
Uetani et al.

[11] Patent Number: 5,336,583
[45] Date of Patent: Aug. 9, 1994

[54] POSITIVE QUINONEDIAZIDE RESIST COMPOSITION UTILIZING MIXED SOLVENT OF ETHYL LACTATE AND 2-HEPTANONE

[75] Inventors: Yasunori Uetani, Toyonaka; Yasunori Doi, Takatsuki; Kazuhiko Hashimoto, Ibaraki; Haruyoshi Osaki, Toyonaka; Ryotaro Hanawa, Ibaraki, all of Japan

[73] Assignee: Sumitomo Chemical Company, Limited, Osaka, Japan

[21] Appl. No.: 161,440

[22] Filed: Dec. 6, 1993

Related U.S. Application Data

[63] Continuation of Ser. No. 873,240, Apr. 24, 1992, abandoned.

[30] Foreign Application Priority Data

Apr. 26, 1991 [JP] Japan .................. 3-097267
Nov. 29, 1991 [JP] Japan .................. 3-316499

[51] Int. Cl.$^5$ .......................... G03F 7/023; G03C 1/61
[52] U.S. Cl. .................................. 430/191; 430/165; 430/192; 430/193
[58] Field of Search .................. 430/191, 192, 193

[56] References Cited

U.S. PATENT DOCUMENTS

| | | | |
|---|---|---|---|
| 4,983,492 | 1/1991 | Trefonas, III et al. | 430/191 |
| 5,128,230 | 7/1992 | Templeton et al. | 430/191 |
| 5,215,857 | 6/1993 | Hosaka et al. | 430/191 |

FOREIGN PATENT DOCUMENTS

| | | |
|---|---|---|
| 0273026 | 6/1988 | European Pat. Off. |
| 0275970 | 7/1988 | European Pat. Off. |
| 0346808 | 12/1989 | European Pat. Off. |
| 0457367 | 11/1991 | European Pat. Off. |
| 2222955 | 9/1990 | Japan |
| 2228665 | 9/1990 | Japan |

Primary Examiner—Charles L. Bowers, Jr.
Assistant Examiner—Christopher G. Young
Attorney, Agent, or Firm—Birch, Stewart, Kolasch & Birch

[57] ABSTRACT

A positive resist composition containing, in admixture, an alkali-soluble resin, a quinone diazide compound and a mixed solvent of ethyl lactate and at least one solvent selected from the group consisting of (a) n-amyl acetate and (b) 2-heptanone in a weight ratio of 5:95 to 80:20, which composition has a good coating properties and provides an improved profile and a large depth of focus.

3 Claims, No Drawings

POSITIVE QUINONEDIAZIDE RESIST COMPOSITION UTILIZING MIXED SOLVENT OF ETHYL LACTATE AND 2-HEPTANONE

This application is a continuation of application Ser. No. 07/873,240 filed on Apr. 24, 1992, now abandoned.

BACKGROUND OF THE INVENTION

1. Field of the Invention

The present invention relates to a positive resist composition which comprises a quinone diazide compound, an alkali-soluble resin and a specific solvent.

1. Description of the Related Art

A composition containing a compound having a quinone diazide group (a quinone diazide compound) and an alkali-soluble resin finds use as a positive resist in the production of integrated circuits.

Recently, with integrated circuits, miniaturization has proceeded with a rise in the integration level, which results in demands for formation of patterns of submicron order. To form such minute patterns with good reproducibility, it is essential that a uniform resist coating is formed and the resist composition has a larger depth of focus.

Hitherto, for the preparation of the resist composition, a cellosolve type solvent has been used as a solvent. In view of health problems of human beings, some solvents such as propylene glycol monomethyl ether acetate, cyclohexanone and ethyl lactate are proposed as substitutes for the cellosolve type solvent. However, the use of propylene glycol monomethyl ether acetate or cyclohexanone will decrease heat resistance of the resist. The use of ethyl lactate having a high viscosity will increase striations or cause some problem in coating such that an edge of a wafer is not coated.

SUMMARY OF THE INVENTION

An object of the present invention is to provide a positive resist composition which is excellent in coating properties and has a good profile and a large depth of focus while maintaining other properties required for a resist such as good heat resistance, high resolution and good sensitivity.

According to the present invention, there is provided a positive resist composition comprising, in admixture, an alkali-soluble resin, a quinone diazide compound and a mixed solvent of ethyl lactate and at least one solvent selected from the group consisting of (a) n-amyl acetate and (b) 2-heptanone in a weight ratio of 5:95 to 80:20.

DETAILED DESCRIPTION OF THE INVENTION

In the positive resist composition of the present invention, a quinone diazide compound may be any one of conventionally used compounds. For example, a quinone diazide compound is an ester of a below described hydroxyl group-containing compound with a quinone diazide sulfonic acid such as 1,2-benzoquinone diazide-4-sulfonic acid, 1,2-naphthoquinone diazide-4-sulfonic acid or 1,2-naphthoquinone diazide-5-sulfonic acid. Preferably, a quinone diazide compound is an ester of a hydroxyl group-containing compound of the formula:

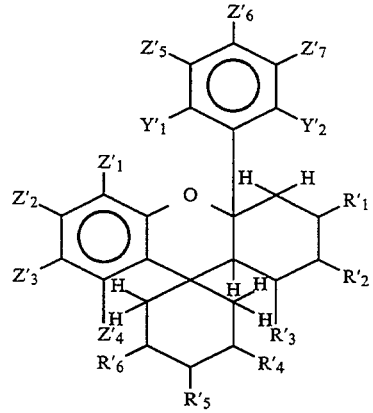

wherein $Y_1'$, $Y_2'$, $Z_1'$, $Z_2'$, $Z_3'$, $Z_4'$, $Z_5'$, $Z_6'$ and $Z_7'$ are the same and different and each a hydrogen atom, a hydroxyl group or a $C_1$-$C_4$ alkyl group provided that at least one of $Y_1'$ and $Y_2'$ is a hydroxyl group and at least two of $Z_1'$, $Z_2'$, $Z_3'$, $Z_4'$, $Z_5'$, $Z_6'$ and $Z_7'$ are hydroxyl groups; and $R_1'$, $R_2'$, $R_3'$, $R_4'$, $R_5'$ and $R_6'$ are the same or different and each a hydrogen atom, a $C_1$-$C_{10}$ alkyl group, a $C_2$-$C_4$ alkenyl group, a $C_5$-$C_8$ cycloalkyl group or an aryl group, or an oxyfravan compound of the formula:

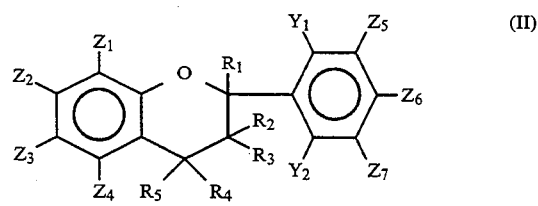

wherein $Y_1$ and $Y_2$ are the same or different and each a hydrogen atom, a hydroxyl group or a $C_1$-$C_4$ alkyl group provided that at least one of them is a hydroxyl group; $Z_1$, $Z_2$, $Z_3$, $Z_4$, $Z_5$, $Z_6$ and $Z_7$ are the same or different and each a hydrogen atom, a halogen atom, a hydroxyl group, a $C_1$-$C_4$ alkyl group, a $C_5$-$C_8$ cycloalkyl group or an aryl group provided that at least two of them are hydroxyl groups; and $R_1$, $R_2$, $R_3$, $R_4$ and $R_5$ are the same or different and each a hydrogen atom, a $C_1$-$C_{10}$ alkyl group, a $C_2$-$C_4$ alkenyl group, a cyclohexyl group or an aryl group provided that at least one of $R_4$ and $R_5$ is a $C_1$-$C_{10}$ alkyl group, a $C_2$-$C_4$ alkenyl group, a cyclohexyl group or an aryl group with the above quinone diazide sulfonic acid.

The quinone diazide compound may be prepared by per se conventional method. For example, the quinone diazide sulfonic acid and the hydroxyl group-containing compound are condensed in the presence of a weak alkali.

Examples of the hydroxyl group-containing compound are hydroquinone, resorcinol, phloroglucin, 2,4-dihydroxybenzophenone, trihydroxybenzophenones (e.g. 2,3,4-trihydroxybenzophenone, 2,2', 3-trihydroxybenzophenone, 2,2',4-trihydroxybenzophenone, 2,2',5-trihydroxybenzophenone, 2,3,3'-trihydroxybenzophenone, 2,3,4'-trihydroxybenzophenone, 2,3',4-trihydroxybenzophenone, 2,3',5-trihydroxybenzophenone, 2,4,4'-trihydroxybenzophenone, 2,4',5-trihydroxybenzophenone, 2',3,4-trihydroxybenzophenone, 3,3',4-trihydroxybenzophenone, 3,4,4'-trihydroxybenzophenone, etc.), tetrahydroxybenzophenones (e.g. 2,3,3',4'-tetrahydroxybenzophenone, 2,3,4,4'-tetrahydroxybenzophenone, 2,2',4,4'-tetrahydroxybenzophenone, 2,2',3,4-tetrahydroxybenzophenone, 2,2',3,4'-tetrahydroxybenzophenone, 2,2',5,5'-tetrahydroxybenzophenone, 2,3',4',5-tetrahydroxybenzophenone, 2,3',5,5'-tetrahydroxybenzophenone, etc.), pentahydroxybenzophenones (e.g. 2,2',3,4,4'-pentahydroxybenzophenone, 2,2',3,4,5'-pentahydroxybenzophenone, 2,2',3,3',4-pentahydroxybenzophenone, 2,3,3',4,5'-pentahydroxybenzophenone, etc.), hexahydroxybenzophenones (e.g. 2,3,3',4,4',5-hexahydroxybenzophenone, 2,2',3,3',4,5'-hexahydroxybenzophenone, etc.), alkyl gallates, the compound of the formula (I), a compound which is disclosed in Japanese Patent Kokai Publication No. 269351/1990 corresponding to U.S. Patent application Ser. No. 07/347,065 and EP-A-0 341 608, and represented by the formula:

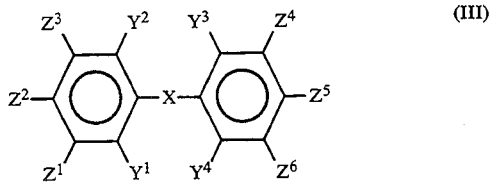

(III)

wherein $Y^1$, $Y^2$, $Y^3$ and $Y^4$ are the same or different and each a hydrogen atom, a halogen atom, an alkyl group or a hydroxyl group provided that at least one of them is a hydroxyl group; $Z^1$, $Z^2$, $Z^3$, $Z^4$, $Z^5$ and $Z^6$ are the same or different and each a hydrogen atom, a halogen atom, an alkyl group, an aryl group or a hydroxyl group provided that at least one of them is a hydroxyl group; and X is a group of the formula: $-C(R^1)(R^2)$ in which $R^1$ and $R^2$ are the same or different and each a hydrogen atom, an alkyl group, an alkenyl group, a cycloalkyl group, an alkoxyl group or an aryl group provided that when at least one of them is a hydrogen atom, an alkyl or aryl group is present at an ortho-position to a hydroxyl group which is present at an ortho-position to the group X.

As the alkali-soluble resin, polyvinylphenol, a novolak resin and the like are exemplified.

The novolak resin is prepared by a condensation reaction of a phenol with an aldehyde. Specific examples of the phenol used as one of the raw materials for the novolak resin include phenol, o-, m- or p-cresol, 2,5-, 3,5- or 3,4-xylenol, 2,3,5-trimethylphenol, 4-, 2- or 3-tert.-butylphenol, 3-, 2- or 4-ethylphenol, 3-methyl-6-tert.-butylphenol, 4-methyl-2-tert.-butylphenol, 2-naphthol, 1,3-, 1,7- or 1,5-dihydroxynaphthalene, and the like. These phenols may be used alone or in combination.

Examples of the aldehyde are aliphatic aldehydes (e.g. formaldehyde, acetaldehyde, etc.), aromatic aldehydes (e.g. benzaldehyde, o-, m- or p-hydroxybenzaldehyde, o- or p-methylbenzaldehyde, etc. ) and the like.

A weight ratio of the quinone diazide compound to the alkali-soluble resin is preferably from 1:1 to 1:7.

A weight ratio of at least one of (a) n-amyl acetate and (b) 2-heptanone to ethyl lactate is from 95:5 to 20:80, preferably from 80:20 to 40:60.

When a ratio of ethyl lactate is too small, the γ-value is greatly decreased. When the ratio of ethyl lactate is too large, the coating property is deteriorated and the profile has a reverse tapered shape.

n-Amyl acetate and 2-heptanone may be used as a mixture in an any weight ratio.

Among combinations of the solvents, a mixture of ethyl lactate and 2-heptanone and a mixture of ethyl lactate, n-amyl acetate and 2-heptanone are preferred, and the mixture of ethyl lactate and 2-heptanone is more preferred.

The solvent system to be used in the present invention is used in an amount that a coating film is uniformly formed on the wafer and no pin hole or no irregular coating is found. Preferably, the solvent system is used in an amount that a total amount of the quinone diazide compound and the alkali-soluble resin is from 3 to 50% by weight based on the whole weight of the resist composition.

Insofar as the effect of the present invention is not deteriorated, the resist composition of the present invention may contain other solvent such as n-butyl acetate, toluene, xylene, methyl isobutyl ketone, methyl ethyl ketone, acetone, 3-methoxybutanol, 3-methoxybutyl acetate, 3-octanone, cyclohexanone, propyleneglycol monoethyl ether acetate, propyleneglycol monomethyl ether acetate, etc.

The positive resist composition is prepared by mixing and dissolving the quinone diazide compound and the alkali-soluble resin in the solvent system of the present invention.

The positive resist composition of the present invention may contain other conventionally used additives such as a sensitizer, other additional resin, a surfactant, a stabilizer or a dye which increases visibility of the formed figure and conventional additives.

The positive resist composition of the present invention has a good coating property, an improved profile and a large depth of focus with maintaining the basic properties of the resist such as good heat resistance, resolution and sensitivity.

PREFERRED EMBODIMENTS OF THE INVENTION

The present invention will be illustrated more in detail by the following Examples, but it is not limited to these Examples. In Examples, "parts" are by weight.

EXAMPLES 1 TO 4 AND COMPARATIVE EXAMPLES 1 TO 5

A mixture of a novolak resin and a quinone diazide compound in amounts shown in the Table was dissolved in a solvent (45 parts). The resulting solution was filtered through a TEFLON (a trademark) filter of 0.2 μm in pore size. The resist solution was coated on a silicone wafer, which had been rinsed in a usual way, by means of a spinner so as to form a resist film of 1.3 μm in thickness. Subsequently, the silicon wafer was baked for 60 seconds on a hot plate kept at 100° C., and exposed to light having a wavelength of 365 nm (i line) while varying the exposure time stepwise by means of a reduction projection exposing apparatus (LD-5010i with NA of 0.40 manufactured by Hitachi). Thereafter, the silicon wafer was post baked (post exposure baking, PEB) on a hot plate kept at 110° C. for 60 second and developed for one minute in a developing solution (SOPD manufactured by Sumitomo Chemical Co., Ltd. ) to obtain a positive pattern.

A resolution is evaluated by measuring a minimum size of a line-and-space pattern at which the pattern is separated without film thickness decrease at an exposure amount at which a line/space ration (L/S) is 1:1 in the line-and-space pattern of 0.8 μm, with a scanning electron microscope.

A profile in the Table is a cross sectional shape of the 0.8 μm line-and-space pattern at the above exposure amount.

A γ-value is expressed in terms of tanθ the angle θ of which is obtained by plotting a standardized film thickness (=the retained film thickness/the original film thickness) against a logarithm of the exposure amount and calculating the inclination of the plotted line. A sensitivity (Eth) is an exposure amount at which the standardized film thickness is zero.

Heat resistance of the resist is expressed in terms of the maximum temperature at which a 3 μm line-and-space pattern is not deformed when the wafer having the pattern is heated on a hot plate for 3 minutes. The deformation of the pattern is observed with a scanning electron microscope.

A coating property is evaluated by unevenness of the coated film having a thickness of 2 μm.

A depth of focus is defined by measuring a width of focus values with which a 0.6 μm line-and-space pattern is separated at an exposure amount that the line/space ratio is 1:1 without causing the film thickness decrease and forming an extreme reverse tapered profile.

The results are shown in the Table.

TABLE

| Example No. | Composition Novolak*1) resin | Quinone diazide compound*2) | Solvent | Resolution (μm) | Eth (msec.) | γ-Value | Heat resistance (°C.) | Profile | Coating property | Depth of focus (μm) |
|---|---|---|---|---|---|---|---|---|---|---|
| 1 | 15 parts | 3 parts | Ethyl lactate (25%) n-Amyl acetate (75%) | 0.5 | 250 | 3.3 | 130 |  | Good | 3.0 |
| 2 | ↑ | ↑ | Ethyl lactate (50%) n-Amyl acetate (50%) | 0.5 | 250 | 3.6 | 130 |  | Good | 3.0 |
| 3 | ↑ | ↑ | Ethyl lactate (25%) 2-Heptanone (75%) | 0.5 | 250 | 3.5 | 130 |  | Good | 3.5 |
| 4 | ↑ | ↑ | Ethyl lactate (50%) 2-Heptanone (50%) | 0.5 | 250 | 3.7 | 130 |  | Good | 3.5 |
| Comp. 1 | 15 parts | 3 parts | Ethyl lactate | 0.5 | 250 | 3.9 | 130 |  | Bad | 2.5 |
| Comp. 2 | ↑ | ↑ | n-Amyl acetate | 0.5 | 250 | 2.3 | 130 |  | Good | 2.5 |
| Comp. 3 | ↑ | ↑ | 2-Heptanone | 0.5 | 250 | 2.1 | 130 |  | Good | 2.5 |
| Comp. 4 | ↑ | ↑ | Propyleneglycol monomethyl ether acetate | 0.6 | 240 | 3.2 | 110 |  | Good | 0.5 |

TABLE-continued

| Example No. | Composition Novolak[1] resin | Quinone diazide compound[2] | Solvent | Resolution (μm) | Eth (msec.) | γ-Value | Heat resistance (°C.) | Profile | Coating property | Depth of focus (μm) |
|---|---|---|---|---|---|---|---|---|---|---|
| Comp. 5 | ↑ | ↑ | Cyclohexanone | 0.6 | 240 | 3.0 | 110 | )( | Good | 0.5 |

Note:
[1] Novolak resin: A cresol mixture (a molar ratio of m-isomer to p- isomer = 4:6) was reacted wtih formalin (a molar ratio of formalin to the cresol = 0.8:1) using oxalic acid as a catalyst to obtain a novolak resin having a weight average molecular weight of 6000 (calculated as polystyrene).
[2] A condensation product of naphthoquinone-(1,2)-diazide-(2)-5-sulfonic chloride with the compound of the formula (a molar ratio of 2.7:1):

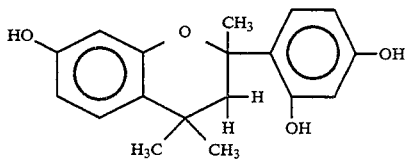

What is claimed is:

1. A positive resist composition consisting essentially of, in admixture, an alkali-soluble resin, a quinone diazide compound and a mixed solvent of ethyl lactate and 2-heptanone in a weight ratio of 5:95 to 80:20, wherein the weight ratio of said quinone diazide compound to said alkali-soluble resin is from 1:1 to 1:7, and said mixed solvent is contained in an amount that the total amount of said quinone diazide compound and said alkali-soluble resin is from 3 to 50% by weight based on the total weight of the positive resist composition.

2. The positive resist composition according to claim 1, wherein said quinone diazide compound is an ester of an oxyflavan compound of the formula:

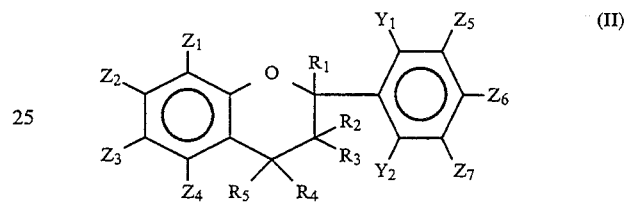

wherein $Y_1$ and $Y_2$ are the same or different and each a hydrogen atom, a hydroxyl group or a $C_1$-$C_4$ alkyl group provided that at least one of them is a hydroxyl group; $Z_1$, $Z_2$, $Z_3$, $Z_4$, $Z_5$, $Z_6$ and $Z_7$ are the same or different and each a hydrogen atom, a halogen atom, a hydroxyl group, a $C_1$-$C_4$ alkyl group, a $C_5$-$C_8$ cycloalkyl group or an aryl group provided that at least two of them are hydroxyl groups; and $R_1$, $R_2$, $R_3$, $R_4$ and $R_5$ are the same or different and each a hydrogen atom, a $C_1$-$C_{10}$ alkyl group, a $C_2$-$C_4$ alkenyl group, a cyclohexyl group or an aryl group provided that at least one of $R_4$ and $R_5$ is a $C_1$-$C_{10}$ alkyl group, a $C_2$-$C_4$ alkenyl group, a cyclohexyl group or an aryl group with a quinone diazide sulfonic acid.

3. The positive resist composition according to claim 1, wherein said alkali-soluble resin is a novolak resin.

* * * * *